United States Patent [19]
Sakurai et al.

[11] Patent Number: 5,860,847
[45] Date of Patent: Jan. 19, 1999

[54] POLISHING APPARATUS

[75] Inventors: Kunihiko Sakurai, Yokohama; Tetsuji Togawa, Chigasaki; Toyomi Nishi, Yokohama; Seiji Katsuoka, Atsugi; Hiromi Yajima; Masako Kodera, both of Yokohama, all of Japan

[73] Assignees: Ebara Corporation, Tokyo; Kabushiki Kaisha Toshiba, Kawasaki, both of Japan

[21] Appl. No.: 708,948

[22] Filed: Sep. 6, 1996

[30] Foreign Application Priority Data

Sep. 6, 1995 [JP] Japan ................................ 7-254549

[51] Int. Cl.$^6$ .......................... H01L 21/66; B24B 49/00
[52] U.S. Cl. ............................. 451/10; 451/41; 451/285; 451/287
[58] Field of Search ................................ 451/8, 10, 11, 451/41, 285, 287, 288, 289; 437/225; 156/626

[56] References Cited

U.S. PATENT DOCUMENTS

| | | | |
|---|---|---|---|
| 4,724,711 | 2/1988 | Sakakibara et al. | 73/862.33 |
| 5,036,015 | 7/1991 | Sandhu et al. | 451/41 |
| 5,069,002 | 12/1991 | Sandhu et al. | 451/41 |
| 5,445,996 | 8/1995 | Kodera et al. | 437/225 |
| 5,639,388 | 6/1997 | Kimura et al. | 451/41 |

FOREIGN PATENT DOCUMENTS 6-216095  8/1994  Japan .

*Primary Examiner*—Eileen P. Morgan
*Attorney, Agent, or Firm*—Wenderoth, Lind & Ponack, L.L.P.

[57] ABSTRACT

A polishing apparatus has a turntable with an abrasive cloth mounted on an upper surface thereof and a top ring disposed above the turntable for supporting a workpiece to be polished against the abrasive cloth under predetermined pressure. The turntable is rotatable by a first motor through a timing pulley connected to the first motor, and the top ring is rotatable by a second motor through a timing pulley connected to the second motor. A torque detector incorporated in the timing pulley connected to at least one of the first motor and the second motor detects an output torque produced by the at least one of the first motor and the second motor.

15 Claims, 4 Drawing Sheets

F I G. 3
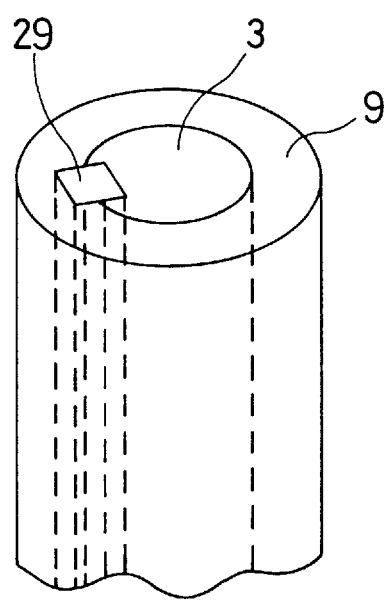

F I G. 4
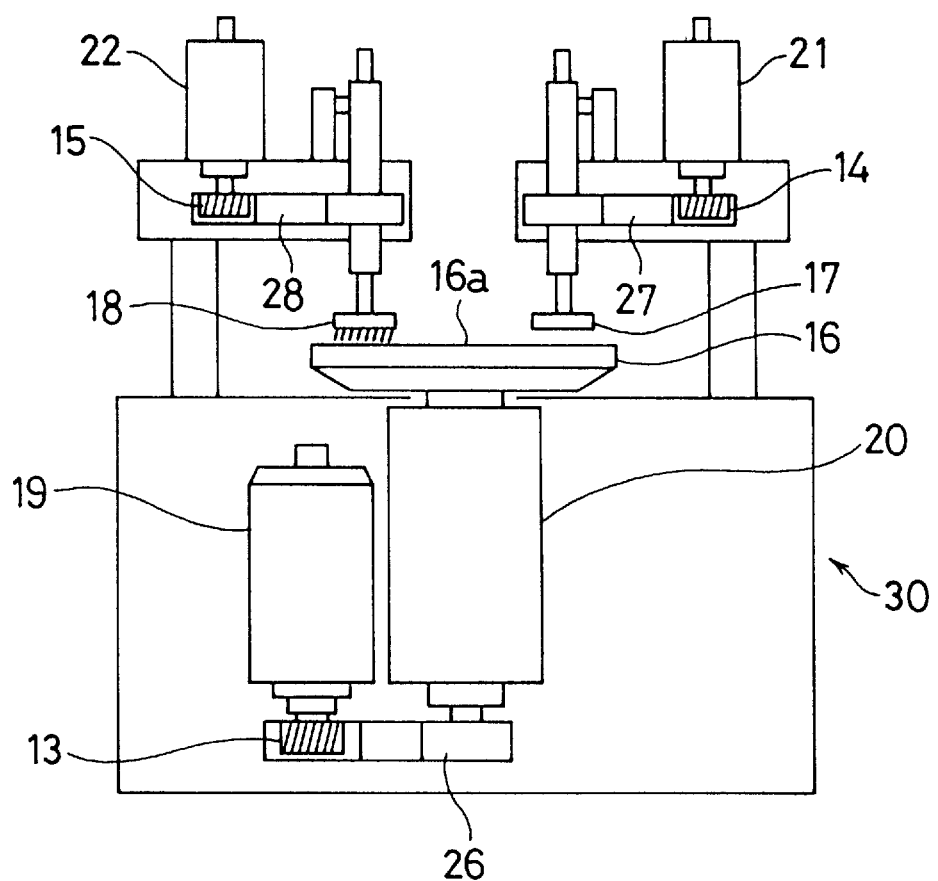

POLISHING APPARATUS

BACKGROUND OF THE INVENTION

1. Field of the Invention

The present invention relates to a polishing apparatus, and more particularly to a torque detecting mechanism for detecting the torque of a turntable of a polishing apparatus for polishing a workpiece such as a semiconductor wafer or the like to a flat, mirror finish.

2. Description of the Prior Art

As semiconductor devices become more highly integrated in recent years, circuit interconnections become thinner and the distances between such interconnections also become smaller. Photolithographic processes for producing interconnections that are 0.5 μm wide or smaller particularly, require a flat image-focusing plane for the stepper because the depth between focal points is small.

Therefore, it is necessary to make the surface of a semiconductor wafer flat before fine circuit interconnections are formed thereon. According to one customary process, semiconductor wafers are polished to a flat finish by a polishing apparatus.

One conventional polishing apparatus comprises a turntable with an abrasive cloth attached to its upper surface, a top ring disposed in confronting relationship to the upper surface of the turntable, and a dressing device for dressing the abrasive cloth, the turntable and the top ring being rotatable at respective independent speeds. The top ring is pressed against the turntable to impart a certain pressure to the turntable, with a workpiece to be polished being interposed between the abrasive cloth and the top ring. While an abrasive fluid is flowing onto the upper surface of the abrasive cloth, the surface of the workpiece is polished to a flat, mirror finish by the abrasive cloth during relative rotation of the top ring and the turntable.

Japanese laid-open patent publication No. 6-216095 discloses a technique for monitoring a torque, i.e., a polishing resistance, acting on a top ring with a torque meter. When the polishing of a semiconductor wafer progresses and the semiconductor wafer is planarized, the polishing resistance is quickly reduced. Therefore, it is possible to detect when the polishing process comes to an end by detecting the polishing resistance with the torque meter. However, the above publication is silent as to details of the torque meter, and is not clear about what type of torque meter is used and how the torque meter is installed to measure the torque applied to the top ring.

U.S. Pat. No. 5,069,002 reveals a technique for detecting an end of the planarization of a semiconductor wafer based on an abrupt reduction in the polishing resistance when the semiconductor wafer is polished to a flat finish. According to this publication, an abrupt reduction in the polishing resistance at the time the semiconductor wafer is planarized, i.e. an end of planarization, is recognized by detecting a change in a drive current supplied to one or both of motors for rotating a top ring and a turntable, respectively.

In order to select a motor that is not overly designed, it is necessary to detect the torque of a motor which rotates the turntable of a polishing apparatus. It has been customary to calculate the torque of such a motor based on a current flowing through the motor because an ordinary torque detector cannot be used with the polishing apparatus due to the large amount of space required for installation thereof. However, since the motor is controlled by an inverter, the current flowing through the motor tends to be affected by the characteristics of the inverter. When operating conditions of the polishing apparatus are changed, the characteristics of the inverter are more likely to affect the current flowing through the motor, making it difficult to recognize the characteristics of the motor. Furthermore, many parameters that are needed for calculation of the torque present difficulties for detecting an accurate value of the torque.

A torque detector for detecting the torque of the turntable or top ring of a polishing apparatus should preferably be small in size and light in weight because it would be used in a clean room. Such a torque detector is required to be electrically connected in a manner not to product dust particles. However, there has not been available a torque detector which does not produce dust particles, and which is small in size and light in weight, can easily be electrically connected to a rotating mechanism of a polishing apparatus, and has a high level of torque detecting accuracy.

SUMMARY OF THE INVENTION

It is therefore an object of the present invention to provide a polishing apparatus having a torque detector which can be housed in a compact fashion in a polishing apparatus housing, does not produce dust particles, and can detect a torque highly accurately.

To achieve the above object, there is provided in accordance with the present invention a polishing apparatus comprising a turntable with an abrasive cloth mounted on an upper surface thereof, a first motor for rotating the turntable through a timing pulley connected to the first motor, a top ring disposed above the turntable for supporting a workpiece to be polished against the abrasive cloth under predetermined pressure, a second motor for rotating the top ring through a timing pulley connected to the second motor, and a torque detector incorporated in the timing pulley connected to at least one of the first motor and the second motor, for detecting an output torque produced by the at least one of the first motor and the second motor.

Each of the first motor and the second motor has an output shaft inserted in the respective timing pulley, the torque detector comprising a detector unit interposed between the output shaft and the timing pulley.

The torque detector is incorporated in the timing pulley connected to at least one of the first motor and the second motor, and has the detector unit interposed between the output shaft and the timing pulley. Therefore, the torque detector does not occupy a large installation space, and can be installed on an existing polishing apparatus without modifying the size of the polishing apparatus.

The detector unit is connected to the timing pulley and the output shaft of the motor without the need for a coupling. Also, the output shaft of the motor is directly connected to a boss of the timing pulley by means of a key. The torque detector can be installed on an existing polishing apparatus simply by replacing timing pulleys and does not produce dust particles.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 3 is a perspective view showing the motor output shaft connected to a boss by means of a key; and FIG. 4 is a vertical elevational view showing a plurality of torque detectors incorporated in a polishing apparatus.

DETAILED DESCRIPTION OF THE PREFERRED EMBODIMENT

Figure 1:
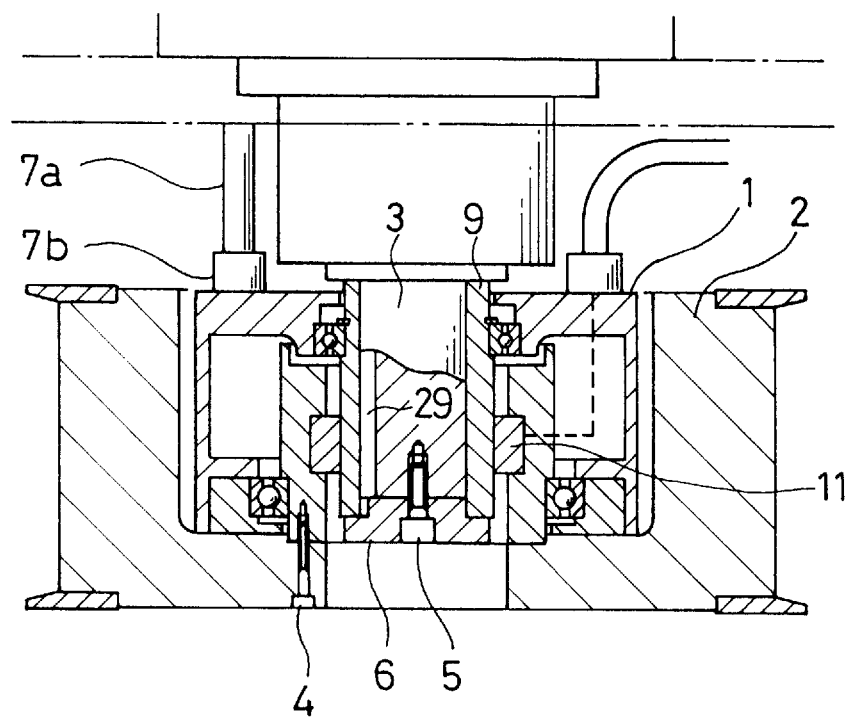
FIG. 1 is a vertical cross-sectional view of a motor output shaft and a timing pulley of a polishing apparatus according to the present invention.

FIG. 1 shows a motor output shaft and a timing pulley of a polishing apparatus according to the present invention. The motor output shaft is used to rotate a turntable or a top ring.

As shown in FIG. 1, a torque detector 1 is incorporated in a timing pulley 2 around which a timing belt (not shown) is trained. The timing belt is also trained around the rotatable shaft of a turntable or a top ring (not shown in FIG. 1) for rotating the turntable or the top ring. The torque detector 1 is housed in the timing pulley 2 and fastened to a lower flange of the timing pulley 2 by eight bolts 4.

The torque detector 1 has a central rotatable boss 9, and an output shaft 3 of a motor has a lower distal end inserted in and securely fastened to the boss 9 with a key 29 as shown in FIG. 3. The output shaft 3 and the boss 9 are fastened to each other by an axial bolt 5 and a cap 6, and the bolt 5 is threaded through cap 6 into the lower end of the output shaft 3. The torque detector 1 has a casing 8 secured to a polishing apparatus housing by a stopper rod 7a and a retainer 7b which prevent the casing 8 from rotating with the output shaft 3 or the timing pulley 2.

Figure 2:
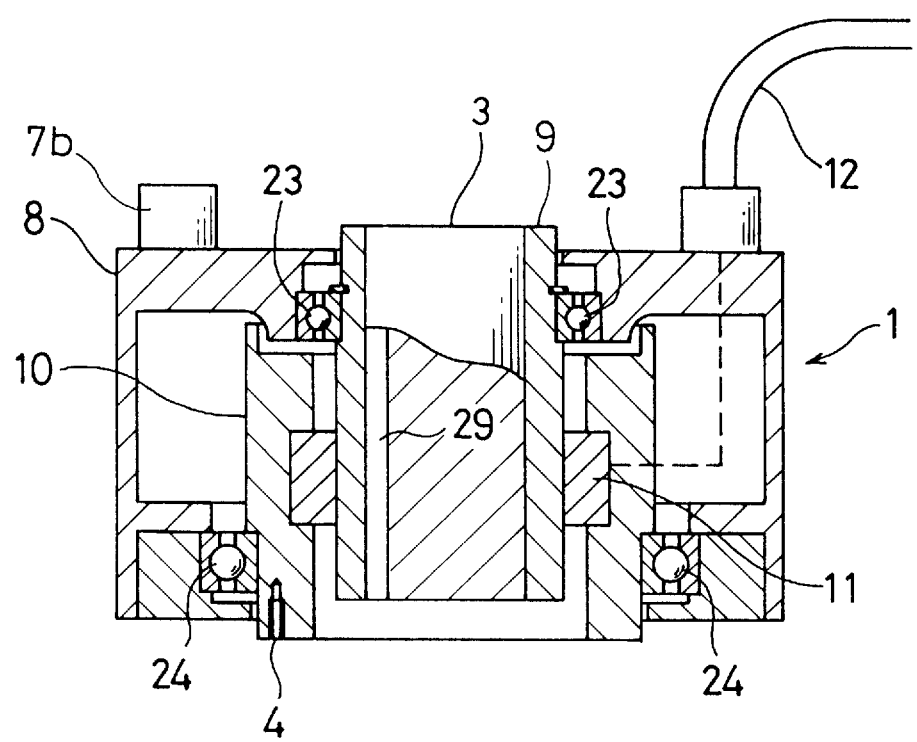
FIG. 2 is a vertical cross-sectional view of a torque detector which is incorporated in the timing pulley shown in FIG. 1.

The torque detector 1 is shown in detail in FIG. 2. As shown in FIG. 2, the boss 9 has a hollow central space in which the lower distal end of the output shaft 3 is fixedly positioned by vertical key 29. The torque detector 1 has a detector unit 11 comprising a strain gage which is securely fitted over the boss 9. The boss 9 is rotatably supported in the casing 8 by a bearing 23. The torque detector 1 also has a driven sleeve 10 disposed around the boss 9 and rotatably supported in the casing 8 by a bearing 24. The outside surface of the detector unit 11 is securely fixed over the driven sleeve 10 for detecting the torque by the strain gage therein. The driven sleeve 10 has its lower axial end fastened to the timing pulley 2 by the bolts 4.

The strain gage of the detector unit 11 is radially interposed between and connected to the boss 9 and the driven sleeve 10. The strain gage outputs an electric signal representative of a strain which is caused by a torque of the timing pulley 2, i.e., a torque of the output shaft 3. Therefore, when the output shaft 3 is rotated upon energization of the motor, the rotational forces are transmitted from the output shaft 3 to the boss 9, generating a strain in the detector unit 11 disposed between the boss 9 and the driven sleeve 10 that is connected to the timing pulley 2 which is placed under a load. The strain gage detects the generated strain and converts the detected strain into an electric signal. The electric signal generated by the strain gage is transmitted through a slip ring (not shown) and a cable 12 to a signal processor (not shown) which converts the electric signal into a corresponding torque value that is indicated on an indicator or recorded by a recorder.

FIG. 4 shows a plurality of torque detectors, each having the above structure shown in FIGS. 1 and 2, which are installed on a polishing apparatus 30. As shown in FIG. 4, the polishing apparatus 30 has a turntable 16 which can be rotated by a motor 19 through a spindle 20 and a timing belt 26. A torque detector 13 is housed in a timing pulley connected to the output shaft of the motor 19. The polishing apparatus 30 also has a top ring 17 for holding a semiconductor wafer to be polished. The top ring 17 can be rotated by a motor 21 through a belt 27. A torque detector 14 is housed in a timing pulley connected to the output shaft of the motor 21. The polishing apparatus 30 also has a dresser 18 for dressing an abrasive cloth 16a attached to the upper surface of the turntable 16. The dresser 18 can be rotated by a motor 22 through a belt 28. A torque detector 15 is housed in a timing pulley connected to the output shaft of the motor 22.

The torque detector 13 serves to detect accurately a torque produced by the motor 19 when the motor 19 is subjected to a load. The torque detector 14 serves to detect accurately a torque produced by the motor 21 when the top ring 17 is subjected to a load during a polishing process. The torque detector 15 serves to detect accurately a torque produced by the motor 22 when the dresser 18 is subjected to a load during a dressing process.

The polishing apparatus 30 is installed in a clean room (not shown) which imposes limitations on space available therein. The torque detectors 13, 14, 15 which are associated with the respective motors 19, 21, 22 of the polishing apparatus 30 do not occupy a large space in the clean room. Since the torque detectors 13, 14, 15 are installed in place without the need for any coupling, the torque detectors 13, 14, 15 do not produce dust particles in the clean room which should be kept clean, and can detect torques with accuracy.

The torque detectors can be attached to an existing polishing apparatus simply by replacing timing pulleys without modifying the size of the polishing apparatus.

The torques detected by the torque detectors connected directly to the output shafts of the respective motors are less liable to be affected by inverters which control the motors. Therefore, the loads applied to the respective motors during operation processes can well be determined based on the detected torques even when operating conditions of the polishing apparatus are changed. The time at which the polishing process is ended is detected on the basis of a change in the loads applied to the motors during the polishing process. Such a change in the loads applied to the motors during the polishing process is represented by a change in the torques applied to the motors during the polishing process, and the torques are detected by the torque detectors connected directly to the output shafts of the respective motors without being affected by the inverters. Thus, an end point of the planarization of the semiconductor wafer polished by the polishing apparatus can easily and accurately be detected by measuring a change in the torques applied to the motors.

Also, the torque detectors are available for selections of motors which are installed in the polishing apparatus, when the polishing apparatus is manufactured, or designed.

Although a certain preferred embodiment of the present invention has been shown and described in detail, it should be understood that various changes and modifications may be made therein without departing from the scope of the appended claims.

What is claimed is:

1. A polishing apparatus comprising:
    a turntable having mounted on an upper surface thereof an abrasive cloth;
    a first motor having connected thereto a first timing pulley, said first motor being coupled to said turntable through said first timing pulley for rotating said turntable;

a top ring positioned above said turntable for supporting a workpiece to be polished against said abrasive cloth;

a second motor having connected thereto a second timing pulley, said second motor being coupled to said top ring through said second timing pulley for rotating said top ring;

at least one of said first motor and said second motor having an output shaft; and a torque detector, incorporated between said output shaft and a respective at least one of said first timing pulley and said second timing pulley, operable to detect an output torque produced by said at least one of said first motor and said second motor.

2. A polishing apparatus as claimed in claim 1, wherein said first timing pulley has incorporated therein a first torque detector, and said second timing pulley has incorporated therein a second torque detector.

3. A polishing apparatus as claimed in claim 2, wherein said first motor includes a first output shaft extending into said first timing pulley, said first torque detector is interposed between said first output shaft and said first timing pulley, said second motor includes a second output shaft extending into said second timing pulley, and said second torque detector is interposed between said second output shaft and said second timing pulley.

4. A polishing apparatus as claimed in claim 1, wherein said out put shaft extends into said respective one of said first timing pulley and said second timing pulley, and said torque detector is interposed between said output shaft and said respective timing pulley.

5. A polishing apparatus as claimed in claim 4, wherein said torque detector comprises a boss fixed to said output shaft and rotatable therewith, a driven sleeve spaced radially outwardly of said boss and fixed to said respective timing pulley for rotation therewith, and a detector unit interposed radially between and connected to said boss and said driven sleeve.

6. A polishing apparatus as claimed in claim 5, wherein said detector unit includes a strain gage.

7. A polishing apparatus as claimed in claim 1, further comprising a dressing device positioned above said turntable for dressing said abrasive cloth, a third motor having connected thereto a third timing pulley, said third motor being coupled to said dressing device through said third timing pulley for rotating said dressing device, and said third timing pulley having incorporated therein another torque detector operable to detect an output torque produced by said third motor.

8. A polishing apparatus comprising:

a turntable having mounted on an upper surface thereof an abrasive cloth;

a top ring positioned above said turntable for supporting a workpiece to be polished against said abrasive cloth;

a motor for rotating one of said turntable or said top ring, said motor including an output shaft;

coupling means connected to said output shaft for transmitting rotation torque produced by said motor to said one of said turntable or said top ring; and a torque detector, interposed between said output shaft and said coupling means, for detecting an output torque produced by said motor.

9. A polishing apparatus as claimed in claim 8, wherein said output shaft extends into said coupling means, and said torque detector is positioned between said output shaft and said coupling means.

10. A polishing apparatus as claimed in claim 9, wherein said torque detector comprises a boss fixed to said output shaft and rotatable therewith, a driven sleeve spaced radially outwardly of said boss and fixed to said coupling means for rotation therewith, and a detector unit interposed radially between and connected to said boss and said driven sleeve.

11. A polishing apparatus as claimed in claim 10, wherein said detector unit includes a strain gage.

12. A method for polishing a workpiece, :said method comprising:

pressing said workpiece by a top ring against an abrasive cloth on an upper surface of a turntable;

transmitting rotation of an output shaft of a first motor to said turntable through a first coupling device mounted on said output shaft;

transmitting rotation of an output shaft of a second motor to said top ring through a second coupling device mounted on said output shaft of said second motor; and detecting an output torque produced by at least one of said first motor and said second motor by a torque detector incorporated between said at least one of said first motor and said second motor and a respective at least one of said first coupling device and said second coupling device.

13. A method as claimed in claim 12, comprising detecting both an output torque produced by said first motor by a first torque detector incorporated between said first motor and said first coupling device and an output torque produced by said second motor by a second torque detector incorporated between said second motor and said second coupling device.

14. A method for detecting an end point of a polishing operation of polishing a workpiece, wherein said polishing operation includes pressing said workpiece by a top ring against an abrasive cloth on an upper surface of a turntable while rotating said turntable by transmitting rotation of an output shaft of a first motor to said turntable and rotating said top ring by transmitting rotation of an output shaft of a second motor to said top ring, said method comprising:

detecting an output torque produced by at least one of said first motor and said second motor by a torque detector incorporated between a respective at least one of said output shaft of said first motor and said output shaft of said second motor and a coupling device mounted thereon; and detecting an occurrence of a change in the thus detected output torque indicative of an end point of said polishing operation.

15. A method as claimed in claim 14, comprising detecting both a first output torque produced by said first motor by a first torque detector incorporated between a first coupling device mounted on said output shaft of said first motor and a second output torque produced by said second motor by a second torque detector incorporated between a second coupling device mounted on said output shaft of said second motor, and detecting an occurrence of a change both of said first output torque and said second output torque as indicative of said end point of said polishing operation.

* * * * *